US008999090B2

(12) United States Patent
Gaudin et al.

(10) Patent No.: US 8,999,090 B2
(45) Date of Patent: Apr. 7, 2015

(54) PROCESS FOR BONDING TWO SUBSTRATES

(71) Applicant: SOITEC, Bernin (FR)

(72) Inventors: Gweltaz Gaudin, Grenoble (FR);
Fabrice Lallement, Aix-les-Bains (FR);
Cyrille Colnat, St. Martin d'Heres (FR);
Pascale Giard, St. Martin d'Heres (FR)

(73) Assignee: SOITEC, Bernin (FR)

( * ) Notice: Subject to any disclaimer, the term of this patent is extended or adjusted under 35 U.S.C. 154(b) by 0 days.

(21) Appl. No.: 13/749,471

(22) Filed: Jan. 24, 2013

(65) Prior Publication Data

US 2013/0139946 A1    Jun. 6, 2013

Related U.S. Application Data

(63) Continuation of application No. 12/811,209, filed as application No. PCT/IB2009/000142 on Jan. 23, 2009, now abandoned.

(30) Foreign Application Priority Data

Feb. 15, 2008    (EP) .................................... 08290150

(51) Int. Cl.
*B32B 37/00* (2006.01)
*H01L 21/18* (2006.01)
*H01L 21/67* (2006.01)
*H01L 21/762* (2006.01)

(52) U.S. Cl.
CPC ........ *H01L 21/187* (2013.01); *H01L 21/67092* (2013.01); *H01L 21/76251* (2013.01)

(58) Field of Classification Search
USPC ........... 156/82, 285, 381, 382, 497, 499, 538, 156/539, 556
See application file for complete search history.

(56) References Cited

U.S. PATENT DOCUMENTS

| 5,393,711 | A | 2/1995 | Biallas et al. |
| 5,769,991 | A | 6/1998 | Miyazawa et al. |
| 6,372,561 | B1 | 4/2002 | Yu ................................. 438/162 |
| 7,910,454 | B2 | 3/2011 | Thallner |
| 8,156,981 | B2 | 4/2012 | Thallner |
| 2004/0151605 | A1 | 8/2004 | Doerr et al. |
| 2005/0064680 | A1 | 3/2005 | Thallner |

(Continued)

FOREIGN PATENT DOCUMENTS

| DE | 19737051 | 3/1999 |
| DE | 10048374 | 4/2001 |

(Continued)

OTHER PUBLICATIONS

International Search Report, PCT/IB2009/000142, mailed Aug. 4, 2009.

(Continued)

*Primary Examiner* — James Sells
(74) *Attorney, Agent, or Firm* — TraskBritt

(57) ABSTRACT

The invention relates to a method for bonding two substrates, in particular, two semiconductor substrates that, in order to be able to improve the reliability of the process, provides the step of providing a gaseous flow over the bonding surfaces of the substrates. The gaseous flow is preferably a laminar flow that is essentially parallel to the bonding surfaces of the substrates, and has a temperature in a range of from room temperature up to 100° C.

16 Claims, 2 Drawing Sheets

(56) References Cited

U.S. PATENT DOCUMENTS

| | | |
|---|---|---|
| 2007/0110917 A1 | 5/2007 | Okada |
| 2007/0111471 A1 | 5/2007 | Okada ............................ 438/455 |
| 2007/0119812 A1 | 5/2007 | Kerdiles et al. |
| 2007/0298362 A1 | 12/2007 | Rocha-Alvarez et al. |

FOREIGN PATENT DOCUMENTS

| | | |
|---|---|---|
| EP | 1396406 | 3/2004 |
| JP | 2006134900 | 5/2006 |
| KR | 20030043478 | 6/2003 |
| WO | WO9807588 | 2/1998 |
| WO | WO2007060145 | 5/2007 |

OTHER PUBLICATIONS

International Search Report, PCT/IB2009/000142, mailed May 4, 2009.

Non-Final Office Action, U.S. Appl. No. 12/811,209, mailed Nov. 5, 2012.

International Preliminary Report on Patentability for International Application PCT/IB2009/000142, mailed Aug. 26, 2010.

International Written Opinion for International Application PCT/IB2009/000142, dated, Apr. 23, 2009 and mailed May 4, 2009.

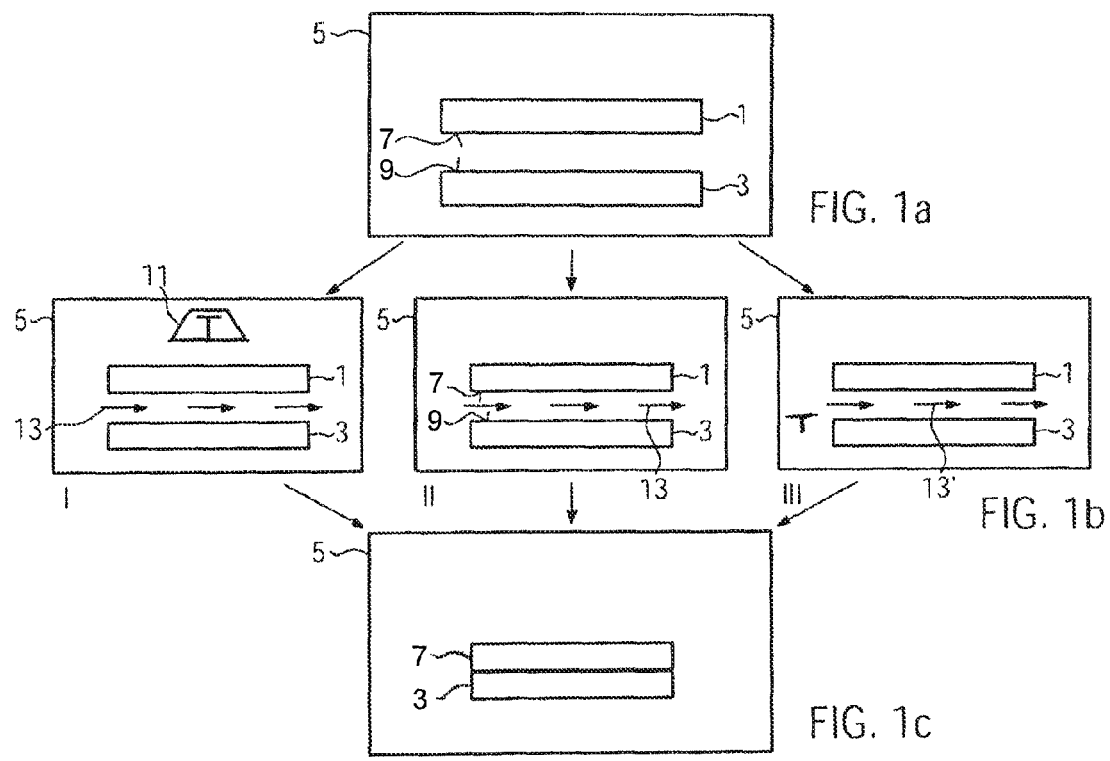
FIG. 1a
FIG. 1b
FIG. 1c
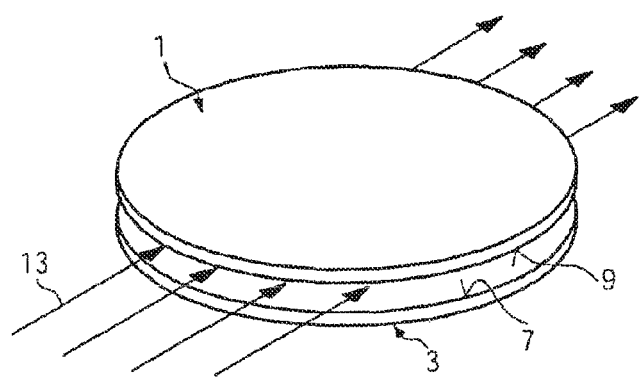
FIG. 2

PROCESS FOR BONDING TWO SUBSTRATES

CROSS-REFERENCE TO RELATED APPLICATIONS

This application is a continuation of U.S. patent application Ser. No. 12/811,209, filed Sep. 14, 2009, now abandoned, which application is a National Phase Entry under 35 U.S.C. §371 of International Patent Application PCT/IB2009/000142, filed Jan. 23, 2009, designating the United States of America and published in English as International Patent Publication WO 2009/101495 A1 on Aug. 20, 2008, which claims the benefit under Article 8 of the Patent Cooperation Treaty and under 35 U.S.C. §119(e) to European Application Serial No. EP08290150.5, filed Feb. 15, 2008.

BACKGROUND

The invention relates to the technical field of bonding by molecular adhesion of two substrates to one another.

Bonding is one way to attach two substrates to each other, which finds application, e.g., in the silicon-on-insulator fabrication technology called SMARTCUT®. Bonding by molecular adhesion is a technique during which two substrates are brought in close contact to each other and wherein the surface properties of the substrates are such that they stick to one another, without the application of further adhesives. The process of bonding is specifically started by applying pressure locally to the two substrates that are placed in close contact, from where a bonding front then spreads out over the entire interface of the two substrates.

WO 2007/060145 discloses such a process for bonding by molecular adhesion. The bonding method described therein comprises, prior to bonding, a step consisting of modifying the surface state of one and/or the other of the substrates to be able to regulate the propagation speed of the bonding front. The surface state is modified by locally or uniformly heating the surface of one and/or the other of the substrates to be bonded. The heating serves to dissolve water from the surface of the substrates before bonding, which allows minimizing of bonding defects. Bonding defects are, for example, so-called edge void defects, which result from the presence of water at the interface. In the SMARTCUT® process, this kind of defect can lead to the presence of non-transferred zones in the final product, e.g., an SOI wafer.

Nevertheless, even using the process of WO 2007/060145, it has been observed that, in a fabrication line, the number of defects rises with the number of substrates bonded inside the bonding tool. Accordingly, there is a need for improved processes that avoid this problem and these are now provided by the present invention.

BRIEF SUMMARY

One embodiment of the present invention is to provide a method with which the increase of bonding defects in bonded substrates can be reduced.

This is achieved by the use of a method for forming a composite substrate that comprises providing two substrates with bonding surfaces; providing a flow of a gas over the bonding surfaces of the substrates; and bonding the substrates together to form the composite substrate. Advantageously, the flow of gas is provided between the two substrates until the bonding surfaces come into contact. Surprisingly, by providing, prior to bonding, a gaseous flow over the bonding surfaces of the substrate, the formerly observed increase of bonding defects could be stopped or at least reduced.

According to a preferred embodiment of the invention, the gaseous flow can be provided between the two substrates. In this case, a flushing of the surfaces can be carried out just until the substrates come into contact. By doing so, the beneficial effect of the gaseous flow can even be enhanced.

Preferably, the gaseous flow can be a laminar flow. It is believed that, by providing the gaseous flow, water that otherwise might saturate the atmosphere of a tool used for bonding, can be removed from the bonding surfaces. By providing the laminar flow, a possible re-entry of water due to turbulences can be prevented.

Advantageously, the flow can essentially be parallel to the bonding surfaces of the substrates. With this feature, the beneficial effect of water removal is further enhanced.

According to an advantageous embodiment, the gaseous flow can be provided during a heat treatment of the two substrates. By doing so, the water removal effect and, as a consequence, the bonding is improved.

Preferably, the gaseous flow can be heated such that the heat treatment is at least partially carried out using the heated gaseous flow. Thus, in addition to heating the substrates via radiation or conduction means, an additional convective heating can be provided.

According to a preferred variant, the heat treatment can be completely carried out using the heated gaseous flow. In this case, the equipment necessary to carry out the heat treatment and/or the bonding do not need additional heating devices.

According to a preferred embodiment, the gaseous flow is stopped prior to the contacting of the two substrates. In other words, the gaseous flow is provided as long as the two substrates are not yet in contact so that the advantageous effects are achieved just until the bonding. Once the substrates are bonded, the gaseous flow is no longer necessary and is stopped to carry out the process in an economical way.

Preferably, the gas of the gaseous flow can have a thermal conductivity of better than $10*10^{-3}$ W/m·K. The higher the thermal conductivity, the easier the gas can be heated up and, furthermore, the heat transferred to the substrates, which further improves the overall process.

Advantageously, the gaseous flow can comprise nitrogen and/or an inert gas, in particular, argon. In particular, the gaseous flow is constituted to at least 10% of one or more of these elements. Furthermore, Nitrogen has a sufficient high thermal conductivity of $24*10^{-3}$ W/m·K and Argon has a thermal conductivity of $Tc(Ar)=16.10^{-3}$ W/m·K. In addition, depending on the mixture of the gas, e.g., $H_2/Ar$, $Cl_2/Ar$, or $F_2/Ar$, hydrophobic surfaces can also be bonded with reduced defects. Hydrophobic Si surfaces should be terminated by Si—dangling bonds and/or Si—H (low polar bonds), but also in case of $Ar/F_2$ (10% $F_2$) gases, by a small portion of Si—F or $=Si_{-F}^{-H}$ bonds. Those bonds, though very polar, allow a bonding without water by $=Si_{-H}^{-F}$ ... F—Si, $=Si$—F ... H—Si or $=Si_{-H}^{-F}$ ... $^{H-F}$ ... $^{H-F}$ ... $^{H-F}$ ... H—Si Bridging.

According to a preferred variant, the gaseous flow treatment can be carried out over a time period starting from seconds up to several minutes. In case an additional heat source is provided, a gaseous flow of just a couple of seconds is sufficiently to achieve the desired results. Thus, the process can be run in a fast and reliable manner. On the other hand, the advantages of the process can also be achieved without an additional heat source by applying the process for a sufficiently long time, typically of the order of minutes.

Preferably, the gaseous flow can have a temperature in a range from room temperature, thus typically 19° C.-24° C., up to 100° C. With a gaseous flow in this temperature range, best results have been achieved over time.

Advantageously, the gaseous flow can be provided in an oxidizing atmosphere, in particular, air or 20% oxygen in nitrogen, and/or in a dry atmosphere or an atmosphere having a low humidity rate.

Another embodiment of the invention is also achieved with the equipment for bonding two substrates to one another as disclosed herein. The inventive equipment for bonding two substrates together to form a composite substrate comprises means for bonding the substrates together and means to provide a laminar gaseous flow between the two substrates at least up until the time that the substrate surfaces contact each other for bonding, so that the same advantages as already described above for the methods of the invention can be achieved.

Preferably, the means to provide a gaseous flow can comprise a ventilation system and/or an aspiration system and/or one or more gas inlets. With such systems, the necessary gaseous flow can be provided in a simple and reliable manner.

Preferably, the means to provide a gaseous flow can be configured to provide a laminar gaseous flow. By doing so, like mentioned above, turbulences are prevented that could eventually lead to a re-entry of unwanted water molecules in the region of the substrate's bonding surfaces.

According to an advantageous embodiment, the means to provide a gaseous flow can be configured to provide the gaseous flow essentially parallel to the substrate surfaces. In this configuration, optimized results can be achieved.

Preferably, the means to provide a gaseous flow further comprises a means to heat the gaseous flow, particularly to temperatures up to 100° C. By doing so, even more water can be removed from the bonding surfaces.

BRIEF DESCRIPTION OF THE DRAWINGS

Advantageous embodiments of the invention will now be described in detail with respect to the following figures:

FIGS. 1A-1C illustrate the process step of a first embodiment according to the invention;

FIG. 2 is a 3D schematic view illustrating a concept of the invention; and

DETAILED DESCRIPTION OF THE INVENTION

Figure 3:
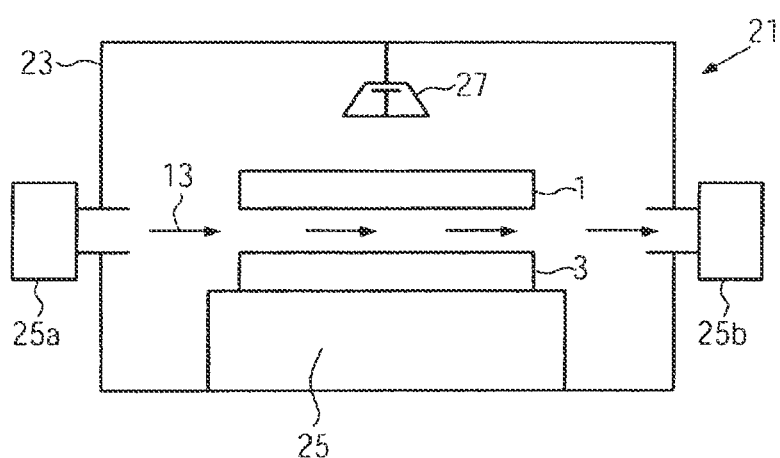
FIG. 3 illustrates a bonding equipment according to the invention.

FIGS. 1A-1C illustrate three embodiments of the inventive process for bonding two substrates. The first step illustrated in FIG. 1A consists in providing two substrates 1 and 3 within a bonding chamber 5. In this embodiment, substrates 1 and 3 are semiconductor wafers, in particular, silicon wafers with or without additional layers provided thereon. They have either a semiconductor or insulating surface, like native oxide.

The two substrates 1 and 3 have been treated to have the necessary surface properties to be able to carry out bonding prior to entering the bonding chamber 5. In the chamber 5, the two substrates 1 and 3 face each other with their respective bonding surfaces 7 and 9. They are held at a certain distance in parallel to each other. To be able to bond them, the bonding chamber 5 comprises a means (not shown) to move the two substrates 1 and 3 with respect to each other, so that they can be brought into contact with each other.

The next step of the inventive method is illustrated in FIG. 1B. Part I of FIG. 1B illustrates a first embodiment, Part II of FIG. 1B, a second embodiment, and Part III of FIG. 1B, a third embodiment.

According to the first embodiment, after the step of providing the two substrates (FIG. 1A), the substrates are heated, e.g., using a lamp 11 or any other suitable heating means, like, for example, provided inside the substrate holder (not shown). According to this embodiment of the invention, a gaseous flow 13, indicated by arrows, is provided between the two substrates 1, 3 and sweeps over the respective surfaces 7 and 9. FIG. 2 illustrates this situation schematically in a three-dimensional way. FIG. 2 shows the two substrates 1 and 3 facing each other with the bonding surfaces 7 and 9. In between, the gaseous flow 13 is provided so that a non-confined atmosphere is created between the two substrates.

The provision of a non-confined atmosphere has the advantage that desorbed water from the surfaces 7 and 9 is trapped by the gaseous flow 13 and transported away from the substrates. This prevents a saturation of the atmosphere inside the bonding chamber 5 due to accumulation of water molecules from wafer to wafer. Therefore, the bonding quality can be kept constant as, from wafer to wafer, the necessary removal of water molecules from the surfaces 7 and 9 can be achieved. Typically, the gaseous flow is provided for a couple of seconds to achieve the desired effect.

In this embodiment, the gaseous flow is a laminar flow that prevents turbulences that could re-introduce water that has already been transported away. To further optimize the inventive process, the flow is provided parallel to surfaces 7 and 9 of substrates 1 and 3 like illustrated in FIG. 2. The gaseous flow according to the embodiment consists of argon, nitrogen and/or any other inert gas or mixture thereof. In this embodiment, the temperature of the gaseous flow is about room temperature, which is typically in a range of 19° C.-24° C.

To provide a hydrophobic bonding, an $H_2/Ar$, $Cl_2/Ar$ or $F_2/Ar$ mixture in a pressure- and temperature-controlled chamber can be used.

Part II of FIG. 1B illustrates a second embodiment of the invention. Elements with the same reference numeral as in Part I are not described in detail again, their description is incorporated herewith by reference.

The difference between the first and second embodiments is that, in the second embodiment, the bonding chamber 5 no longer comprises a heating means 11. In this case, the gaseous flow 13, still at room temperature, is applied for a longer time, in particular, for several minutes, to be able to eliminate about the same water quantity from the surfaces 7 and 9 of the wafers 1 and 3 as in the first embodiment. Thus, in this embodiment, a simplified bonding chamber 5, not needing an additional heating device, can be used.

Part III of FIG. 1B illustrates a third embodiment of the inventive method. Again, features having the same reference numerals as previously used are not explained in detail but their description is incorporated herewith by reference.

The difference of the third embodiment compared to the second embodiment is that, instead of using a gaseous flow 13 at room temperature, the gaseous flow 13' in this embodiment has a temperature higher than room temperature, in particular, of up to 100° C. By doing so, it is again possible to remove the water from the surfaces 7 and 9 of substrates 1 and 3 while applying the gaseous flow 13' for a shorter time compared to the second embodiment and, at the same time, no additional heating device like in the first embodiment is needed.

For best results, the gaseous flow shall consist (at least to a percentage of 10%) of an inert gas or mixture thereof having a high thermal conductivity, such that the necessary heat transfer from the gas to the substrates 1, 3 can be optimized. In addition to that, the features of the gaseous flow 13' correspond to the one of gaseous flow 13, in particular, the gaseous flow shall be a laminar flow parallel to the surfaces 7 and 9.

Of course, embodiments 1-3 can be freely combined, for example, a gaseous flow 13' with a temperature higher than room temperature can be used in combination with a further heating means 11, such that part of the heat treatment prior to bonding is provided by the gaseous flow and the remaining part by the heating means 11.

FIG. 1C illustrates the third step of the inventive method, which consists of bringing the two substrates 1 and 3 into close contact with each other to thereby start bonding. Bonding is typically initiated by local application of a light pressure followed by a bonding front, which spreads out over the entire interface.

Just prior to the situation when the substrates 1, 3 touch each other, the gaseous flow between the substrates 1, 3 can be stopped.

The inventive method has the advantage that it allows the removal of water absorbed on the surfaces of the substrates to be bonded in a reliable and repeatable manner compared to the prior art. Due to the reduced amount of water in the bonding interface, fewer bonding defects occur, which, in turn, render the bonded substrate better in quality. The inventive process is of particular interest in the so-called SMART-CUT®-type process used to, e.g., form silicon-on-insulator substrates for the electronics industry and that consists of transferring a layer from a donor substrate onto a handle substrate, wherein attachment between the donor substrate and the handle substrate is achieved by bonding.

In the above-described embodiments one to three, the gaseous flow 13, 13' was provided inside the bonding chamber 5 between the two substrates 1 and 3 facing each other. According to a variant of the invention (not illustrated), the flushing of the bonding surfaces 7, 9 with the gaseous flow could also be carried out outside the bonding chamber 5 just before entering the substrates 1 and 3 into the chamber 5. In this configuration, it is also possible to sweep the surfaces 7, 9 individually, in parallel or one after the other. Furthermore, a non-confined atmosphere could also be achieved by moving the two substrates through an inert gas.

FIG. 3 illustrates one embodiment of an inventive equipment for bonding two substrates. The bonding equipment 21 illustrated can serve as bonding chamber 5 like described above with respect to embodiments 1-3.

The bonding equipment 21 comprises a chamber 23. Inside the chamber 23, a substrate holder 25 is provided to hold the substrates 1 and 3 such that the bonding surfaces 7 and 9 face each other.

According to the invention, the bonding equipment 21 comprises means 25a and 25b to provide a gaseous flow between the two substrates 1 and 3. In this embodiment, the means to provide a gaseous flow comprises a ventilation system 25a, which provides the gaseous flow 13, which is then aspirated by an aspiration system 25b to remove the flow comprising water molecules desorbed from the surfaces of substrates 1 and 3.

As an alternative, instead of using a ventilation system 25a, one or more gas inlets could also be provided that are connected to a corresponding gas supply. It is important to mention that the means to provide the gaseous flow is preferably arranged and configured such that the gaseous flow 13 is a laminar flow, the advantages of which are described above. Furthermore, the means to provide the gaseous flow are preferably configured such that the flow 13 is parallel to the substrate surfaces. According to a variant, the ventilation system 25a could also be designed to have two or more gaseous flows coming from several directions.

Depending on the process carried out (see part I of FIG. 1B), the bonding equipment can furthermore comprise heating means 27, e.g., a lamp, which could be located upon the center or the edge of the wafer to heat locally or totally the surfaces of the wafer to be bonded.

What is claimed is:

1. A method for reducing bonding defects when bonding two substrates to one another, which comprises, prior to bonding, providing a gaseous flow over bonding surfaces between the substrates until the substrates come into contact, wherein providing the gaseous flow comprises using a gas inflow device and a gas outflow device arranged and configured such that the gaseous flow is a laminar flow that is essentially parallel to the bonding surfaces of the substrates, and the gaseous flow has a temperature in a range of from room temperature up to 100° C.; and thereafter bonding the substrates together to reduce defects compared to bonding substrates without the prior gaseous flow over the bonding surfaces.

2. The method according to claim 1, wherein the gaseous flow is provided during a heat treatment of the two substrates.

3. The method according to claim 2, wherein the gaseous flow is heated such that the heat treatment is at least partially carried out using the heated gaseous flow.

4. The method according to claim 3, wherein the heat treatment is completely carried out using the heated gaseous flow.

5. The method according to claim 1, wherein the gaseous flow comprises a gas having a thermal conductivity of $10*10^{-3}$ W/m.K.

6. The method according to claim 1, wherein the gaseous flow comprises an inert gas.

7. The method according to claim 6, wherein the inert gas is nitrogen or argon.

8. The method according to claim 1, wherein the gaseous flow is provided in an oxidizing atmosphere.

9. The method according to claim 8, wherein the oxidizing atmosphere is air or 20% oxygen in nitrogen.

10. The method according to claim 1, wherein the gaseous flow is provided in a dry atmosphere or an atmosphere having a low humidity rate.

11. The method according to claim 1, wherein the gaseous flow treatment is carried out over a time period of from several seconds up to several minutes.

12. The method according to claim 1, wherein the substrates are semiconductor substrates.

13. A method for reducing bonding defects when bonding two semiconductor substrates to one another, which comprises, prior to bonding, providing a gaseous flow over bonding surfaces between the substrates until the substrates come into contact, wherein providing the gaseous flow comprises using a gas inflow device and a gas outflow device arranged and configured such that the gaseous flow is a laminar flow that is essentially parallel to the bonding surfaces of the substrates, the gaseous flow has a temperature in a range of from room temperature up to 100° C., and the gaseous flow treatment is carried out over a time period of from several seconds up to several minutes; and thereafter bonding the substrates together by bringing the substrates into close contact and locally applying a pressure to create a bonding front which spreads between the substrates with the gaseous flow stopped when the substrates touch each other to thereby reduce defects compared to bonding substrates without the prior gaseous flow over the bonding surfaces.

14. The method according to claim 13, wherein the gaseous flow is provided during a heat treatment of the two substrates.

15. The method according to claim 13, wherein the gaseous flow comprises an inert gas.

16. The method according to claim 13, wherein the gaseous flow is provided in an oxidizing atmosphere.

* * * * *